United States Patent
Wilkinson et al.

(10) Patent No.: US 7,318,995 B2
(45) Date of Patent: Jan. 15, 2008

(54) METHOD OF MAKING A NEGATIVE-WORKING LITHOGRAPHIC PRINTING PLATE

(75) Inventors: Sue Wilkinson, Vancouver (CA); Huub Van Aert, Pulderbos (BE); Dirk Faes, Herselt (BE); Joan Vermeersch, Deinze (BE)

(73) Assignee: Agfa Graphics NV, Mortsel (BE)

( * ) Notice: Subject to any disclaimer, the term of this patent is extended or adjusted under 35 U.S.C. 154(b) by 0 days.

(21) Appl. No.: 11/239,534

(22) Filed: Sep. 29, 2005

(65) Prior Publication Data

US 2006/0073418 A1 Apr. 6, 2006

Related U.S. Application Data

(60) Provisional application No. 60/617,200, filed on Oct. 8, 2004.

(30) Foreign Application Priority Data

Oct. 1, 2004 (EP) .................... 04104833

(51) Int. Cl.
*G03F 7/03* (2006.01)
(52) U.S. Cl. ............... 430/302; 430/138; 430/278.1; 101/467
(58) Field of Classification Search ............... 430/138, 430/270.1, 281.1, 302, 309, 434, 435, 494, 430/944, 945; 101/467
See application file for complete search history.

(56) References Cited

U.S. PATENT DOCUMENTS

| 4,786,581 | A | 11/1988 | Stahlhofen et al. | |
| 4,868,016 | A | 9/1989 | Lorah et al. | |
| 4,885,230 | A | 12/1989 | Stahlhofen et al. | |
| 4,983,478 | A | 1/1991 | Stahlhofen et al. | |
| 5,541,261 | A | 7/1996 | Fock et al. | |
| 7,001,704 | B2 * | 2/2006 | Oshima et al. | 430/138 |
| 2003/0164105 | A1 * | 9/2003 | Tashiro | 101/453 |
| 2003/0170570 | A1 | 9/2003 | Vander et al. | |

FOREIGN PATENT DOCUMENTS

| DE | 2 626 473 | | 1/1977 |
| EP | 0 222 297 | A2 | 5/1987 |
| EP | 0 514 145 | A1 | 11/1992 |
| EP | 0 665 240 | A1 | 8/1995 |
| EP | 0 770 497 | A1 | 5/1997 |
| EP | 1 025 992 | A1 | 8/2000 |
| EP | 1 219 416 | A1 | 7/2002 |
| EP | 1 342 568 | A1 | 9/2003 |
| EP | 1 442 877 | A2 * | 8/2004 |
| GB | 887 356 | | 1/1962 |
| GB | 1 107 249 | | 3/1968 |
| GB | 1 555 233 | | 3/1968 |

OTHER PUBLICATIONS

European Search Report in 04 10 4833 (Mar. 1, 2005).
F. R. Mayers; *Management of Change in the Aluminum Printing Industry*; published in the ATB Metallurgie Journal; vol. 42 nr. 1-2; p. 69 (2002).
Haddleton et al.; *J. Polym. Sci.*; Polym. Chem. Ed.; vol. 39; p. 2378 (2001).

* cited by examiner

*Primary Examiner*—John S. Chu
(74) *Attorney, Agent, or Firm*—Leydig, Voit & Mayer, Ltd.

(57) ABSTRACT

A method for preparing a negative-working lithographic printing plate is provided which comprises the steps of (1) providing a lithographic printing plate precursor comprising on a grained and anodized aluminum support, having a hydrophilic surface, a coating comprising (i) polymer particles which are core-shell particles having a hydrophobic heat-softenable core and a hydrophilic shell and (ii) an infrared light absorbing agent, (2) exposing said coating to heat, thereby inducing coalescence of said polymer particles at exposed areas of said coating, and (iii) developing said precursor by applying a gum solution to said coating, thereby removing non-exposed areas of said coating from said support.

According to the above method the printing plates exhibit after ageing an improved clean-out and a reduced background stain, resulting in toning-free printing.

13 Claims, No Drawings

METHOD OF MAKING A NEGATIVE-WORKING LITHOGRAPHIC PRINTING PLATE

CROSS-REFERENCE TO RELATED PATENT APPLICATIONS

This application claims the benefit of U.S. Provisional Application No. 60/617,200 filed Oct. 8, 2004, which is incorporated by reference. In addition, this application claims the benefit of European Application No. 04104833.1 filed Oct. 1, 2002, which is also incorporated by reference.

FIELD OF THE INVENTION

The present invention relates to a method for making a lithographic printing plate precursor and to a method for making a lithographic printing plate.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a plate precursor by means of a so-called plate-setter.

Especially thermal plates, which are sensitive to heat or infrared light, are widely used in computer-to-plate methods because of their daylight stability. Such thermal materials may be exposed directly to heat, e.g. by means of a thermal head, but preferably comprise a compound that converts absorbed light into heat and are therefore suitable for exposure by lasers, especially infrared laser diodes. The heat, which is generated on image-wise exposure, triggers a (physico-)chemical process, such as ablation, polymerization, insolubilization by cross-linking of a polymer, decomposition, or particle coagulation of a thermoplastic polymer latex, and after optional processing, a lithographic image is obtained. Many thermal plate materials are based on heat-induced ablation. A problem associated with ablative plates is the generation of debris which is difficult to remove and may disturb the printing process or may contaminate the exposure optics of the plate-setter. As a result, such ablative plates require a processing step for removing the debris from the exposed material.

EP 770 497 discloses a method wherein an imaging material comprising an image-recording layer of a hydrophilic binder, a compound capable of converting light to heat and hydrophobic thermoplastic polymer particles, is image-wise exposed, thereby inducing coalescence of the polymer particles and converting the image-recording layer into an hydrophobic phase which defines the printing areas of the printing master. Subsequently the image-wise exposed precursor is developed by rinsing it with plain water or an aqueous liquid.

EP 514 145 discloses a radiation-sensitive plate which comprises a coating comprising core-shell particles having a water insoluble heat softenable core component and a shell component which is soluble or swellable in aqueous alkaline medium. The radiation causes selected particles to coalescence, at least partially, to form an image and the non-coalesced particles are then selectively removed by means of an aqueous alkaline developer.

EP 1 342 568 discloses a method wherein an imaging material comprising an image-recording layer of a hydrophilic binder, a compound capable of converting light to heat and hydrophobic thermoplastic polymer particles, is image-wise exposed, thereby inducing coalescence of the polymer particles and converting the image-recording layer into an hydrophobic phase which defines the printing areas of the printing master. Subsequently the image-wise exposed precursor is processed with a gum solution, thereby developing and gumming the plate in a single step. In this single step process, the image-recording layer at the non-exposed areas is removed with the gum solution from the support, revealing the hydrophilic surface of the support, also called "clean-out", and simultaneously the hydrophilic surface in these non-image areas is protected from contamination (fingerprints, fats, oils, dust, oxidation, etc.) by the gum.

An important prerequisite for a high quality printing plate precursor is its shelf-life stability. A problem associated with printing plate precursors of the prior art which are based on heat-induced coagulation of thermoplastic polymer particles and are processed with a gum solution, is a lack in shelf-life stability: after ageing the precursor under high humidity condition the "clean-out" is insufficient and toning appears. "Toning" means an increased tendency of ink-acceptance at the non-image areas. It is important in the preparation of high quality printing plates to avoid toning as much as possible.

SUMMARY OF THE INVENTION

It is an object of the present invention to provide a method for making a negative-working lithographic printing plate with an improved clean-out and with an improved shelf-life stability of the cleaning-out capability.

According to the present invention, these objects are realized by the method of preparing a negative-working lithographic printing plate comprising the steps of (1) providing a lithographic printing plate precursor comprising on a grained and anodized aluminum support, having a hydrophilic surface, a coating comprising (i) polymer particles which are core-shell particles having a hydrophobic heat-softenable core and a hydrophilic shell and (ii) an infrared light absorbing agent, (2) exposing said coating to heat, thereby inducing coalescence of said polymer particles at exposed areas of said coating, and (3) developing said precursor by applying a gum solution to said coating, thereby removing non-exposed areas of said coating from said support.

In the present invention, it has been found that the hydrophilic shell of said core-shell particles in the coating improves the clean-out in the developing step of the image-wise exposed precursor with a gum solution and delivers a toning free printing plate, even after storing the printing plate precursor under high humidity conditions. The method for measuring the clean-out is described in the examples by the background stain and by the residual polymer left on the non-exposed areas of the plate.

Specific embodiments of the present invention are defined in the dependent claims. Further advantages and embodiments of the present invention will become apparent from the following description.

DETAILED DESCRIPTION OF THE INVENTION

The coating provided on the support comprises an image-recording layer which contains polymer particles which have a hydrophobic heat-softenable core and a hydrophilic shell, hereinafter also referred to as "core-shell particles". The core-shell particles contain distinct domains of component (A) and (B). The domains are arranged so that component (A)(the core) is encapsulated by component (B)(the shell) with the core and shell being linked to each other by strong physical interaction or by chemical bonding.

The component (A) is a hydrophobic polymer which is water-insoluble and heat-softenable. Heat-softenable means that the hydrophobic polymer has a minimum film-forming temperature (MFT) at least above ambient temperature, preferably above 50° C., more preferably above 80° C. Water-insoluble means that the hydrophobic polymer essentially does not dissolve in water.

The component (B) is a hydrophilic polymer which is soluble in water at neutral pH or at a pH ranging between 5 and 7. The link of the hydrophilic polymer to the core can be obtained by a chemical bonding or by a physical interaction between the core polymer and the shell polymer. Several methods are known for preparing core-shell particles as described in U.S. Pat. No. 4,868,016, GB 887,356 and GB 1,107,249. In a preferred method, the core-shell particle is prepared in two steps: in a first step a macromonomer, hereinafter also referred to as "macromer", is prepared with the hydrophilic polymer and, in a second step, this macromer is copolymerised with hydrophobic monomers forming the core. The hydrophilic macromer is a hydrophilic polymer having at least one monomeric double bound which is capable of being copolymerized with the hydrophobic monomers. The hydrophilic macromer can be prepared by polymerization of a hydrophilic monomer with a catalytic chain transfer agent or by an addition-fragmentation transfer of a dimer or an oligomer. A useful preparation method for macromers prepared using cobalt complexes is described by David M. Haddelton (D. M. Haddleton, E. Depaquis, E. J. Kelly, D. Kukulj, S. R. Morsley, S. A. F. Bon, M. Eason, A. G. Steward, J. Polym. Sci., Polym. Chem. Ed., vol. 39, 2378 (2001). Such macromers are also available from the company WARWICK EFFECT POLYMERS, situated at the University of Warwick Science Park, Coventry, UK. After copolymerization of the macromer with hydrophobic monomers graft copolymers can be formed. Such a graft copolymer can also be obtained by a chemical reaction between a functional group present on the hydrophilic polymer and another functional group present on the polymer constituting the core. In another preferred method, the core-shell particle is prepared by a polymerization reaction of a hydrophobic monomer, constituting the core, in the presence of a amphiphilic block or graft copolymer with hydrophilic and hydrophobic segments. These hydrophobic segments are incorporated in the core and in this way the hydrophilic shell is linked to the core by a physical interaction. Such amphiphilic copolymers are block or graft copolymers and the hydrophobic segments may be composed of the same hydrophobic monomers as mentioned for the core of the core-shell particle and the hydrophliic segments may be composed of the same hydrophilic monomers as mentioned for the shell of the core-shell particle. A typical example is a block copolymer of poly methylmethacrylate and poly methacrylic acid. Examples of preparation methods for such blockcopolymers are described in EP 665 240 or U.S. Pat. No. 5,541,261 by the company Th. GOLDSCHMIDT AG in Essen, Germany.

Specific examples of hydrophobic polymers in the core of the core-shell particles are polyethylene, poly(vinyl chloride), poly(methyl (meth)acrylate), poly(ethyl (meth)acrylate), poly(vinylidene chloride), poly(meth)acrylonitrile, poly(vinyl carbazole), polystyrene or copolymers thereof. Polystyrene and poly(meth)acrylonitrile or their derivatives are highly preferred embodiments. According to such preferred embodiments, the hydrophobic polymer comprises at least 50 wt. % of polystyrene, and more preferably at least 60 wt. % of polystyrene. In order to obtain sufficient resistivity towards organic chemicals, such as the hydrocarbons used in plate cleaners, the polymer preferably comprises at least 5 wt. %, more preferably at least 30 wt. % of nitrogen containing monomeric units or of units which correspond to monomers that are characterized by a solubility parameter larger than 20, such as (meth)acrylonitrile. Suitable examples of such nitrogen containing monomeric units are disclosed in EP-A 1 219 416.

According to the most preferred embodiment, the hydrophobic polymer is a copolymer consisting of styrene and acrylonitrile units in a weight ratio between 1:1 and 5:1 (styrene:acrylonitrile), e.g. in a 2:1 ratio.

In correspondence with the specific examples of hydrophobic polymers, the following monomers are specific examples of hydrophobic monomers which can be used in the preparation of the core of the core-shell particle or in the preparation of the hydrophobic segments of the amphiphilic copolymers: ethylene, vinyl chloride, methyl (meth)acrylate, ethyl (meth)acrylate, vinylidene chloride, (meth)acrylonitrile, vinyl carbazole, styrene or mixtures thereof. Styrene and (meth)acrylonitrile or their derivatives are highly preferred embodiments.

Specific examples of monomers which can be used in the preparation of the shell of the core-shell particle or in the preparation of the hydrophilic segments of the amphiphilic copolymers are: acrylic acid, methacrylic acid, maleic acid, itaconic acid, crotonic acid, fumaric acid, vinyl alcohol, ethylene oxide, hydroxyethylacrylamide, isopropylacrylamide, N-vinylpyrolidone, sulfoethylmethacrylate; acrylic acid and methacrylic acid are preferred.

According to a preferred embodiment, the amount of hydrophilic polymer of the shell, ranges between 1 to 30 wt % of the total weight of the core-shell particle, more preferably between 2 to 20 wt %, most preferably between 3 to 10 wt %. In another preferred embodiment, the amount of hydrophobic polymer of the core, ranges between 70 to 99 wt % of the total weight of the core-shell particle, more preferably between 80 to 98 wt %, most preferably between 90 to 97 wt %.

The polymer particles preferably have a number average particle diameter below 200 nm, more preferably between 5 nm and 150 nm, most preferably between 10 nm and 120 nm as measured by Photon Correlation Spectroscopy using a Brookhaven BI-90 Particlesizer. The amount of polymer particles contained in the image-recording layer is preferably between 20 wt. % and 95 wt. % and more preferably between 25 wt. % and 90 wt. % and most preferably between 30 wt. % and 85 wt. %.

The polymer particles can be applied as a dispersion in an aqueous coating liquid of the image-recording layer and the hydrophilic shell may stabilize the dispersion.

The image-recording layer preferably comprises a hydrophilic binder, e.g. homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

In accordance with the present invention the image-recording layer comprises an infrared absorbing agent. The infrared absorbing agents are compounds capable of converting infrared light into heat. Particularly useful infrared absorbing agents capable of converting infrared light into heat are for example infrared dyes, carbon black, metal carbides, borides, nitrides, carbonitrides, bronze-structured oxides, and conductive polymer dispersions such as polypyrrole, polyaniline or polythiophene dispersions.

The image-recording layer may also contain other ingredients such as additional binders, surfactants, colorants and development inhibitors or accelerators. The colorants are preferably dyes or pigments which provide a visible image after processing.

The coating may also contain one or more additional layer(s), adjacent to the image-recording layer. Such additional layer can e.g. be an adhesion-improving layer between the image-recording layer and the support; or a light-absorbing layer comprising one or more of the above compounds that are capable of converting infrared light into heat; or a covering layer which is removed during processing with the gum solution.

The support of the plate precursor and of the printing plate is a grained and anodized aluminum support. Graining an anodizing of aluminum supports is well known. The grained aluminum support used in the material of the present invention is preferably an electrochemically grained support. The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m$^2$ of Al$_2$O$_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

The anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.1 and 20 g/m$^2$ of the surface protective compound.

A gum solution is normally supplied as a concentrated solution which is diluted by the end user with water before use. In the present description, all concentrations of compounds present in the gum solution are expressed as percentage by weight (wt. % or % w/w) relative to the non-diluted gum solution, unless otherwise indicated.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 40 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylenedinaphtalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 20 wt. %.

A typical gum solution has a pH from 3 to 7. The pH of the gum solution is usually adjusted with a mineral acid, an organic acid or an inorganic salt in an amount of from 0.01 to 2 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

In a non-limiting explanation it may be understood that, due to the low pH-value (between 3 and 7) of the gum solution, a completely removal of the coating is not easily obtained in the processing step with a gum solution. Therefor it has been found that specially due to the presence of a hydrophilic shell, surrounding the hydrophobic core of the core-shell particle, surprisingly the clean-out is improved specifically after high humidity shelf-life ageing of the precursor and toning is avoided.

The gum solution further comprises preferably an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

In accordance with another embodiment of the present invention, the gum solution as developer in the processing of the plate comprises preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 5 and 7, more preferably between 6 and 7.

Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 1.0 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of e.g. between 1.7 and 5 cP, by adding viscosity increasing compounds, such as poly(ethylene oxide), e.g. having a molecular weight between $10^5$ and $10^7$. Such compounds can be present in a concentration of 0.01 to 10 g/l.

A baking gum has a similar composition as described above, with the additional preference towards compounds that do not evaporate at the usual bake temperatures. Specific examples of suitable baking gum solutions are described in e.g. EP-A 222 297, EP-A 1 025 992, DE-A 2 626 473 and U.S. Pat. No. 4,786,581.

The printing plate precursors used in the present invention are exposed to heat or to infrared light, e.g. by means of an infrared laser or LEDs. Preferably, a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 µm), the scan speed and the resolution of the exposure apparatus (i.e. the number of addressable pixels per unit of linear distance, often expressed in dots per inch or dpi; typical value: 1000-4000 dpi). Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

Due to the heat generated during the exposure step, the polymer particles fuse or coagulate so as to form a hydrophobic phase which corresponds to the printing areas of the printing plate. Coagulation may result from heat-induced coalescence, softening or melting of the polymer particles. There is no specific upper limit to the coagulation temperature of the polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

In the development step, the non-exposed areas of the image-recording layer are removed by supplying a gum or baking gum solution without essentially removing the exposed areas, i.e. without affecting the exposed areas to an extent that renders the ink-acceptance of the exposed areas inacceptable. The development by supplying a gum or baking gum may be combined with mechanical rubbing, e.g. by a rotating brush. The gum or baking gum solution can be applied to the plate e.g. by rubbing in with an impregnated pad, by dipping, (spin-)coating, spraying, pouring-on, either by hand or in an automatic processing apparatus. After applying the baking gum solution, the plate can be dried before baking or is dried during the baking process itself. The baking process can proceed at a temperature above the coagulation temperature of the thermoplastic polymer particles, e.g. between 100° C. and 230° C. for a period of 5 to 40 minutes. For example the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet spectrum.

EXAMPLES

Preparation of Comparative Polymer Particle CL-01

Styrene and acrylonitrile are copolymerised via a semi-continuous emulsion polymerisation. A 400 liter reactor is filled with 56 liter of demineralized water and 0.429 kg Empicol ESB/70, an anionic surfactant commercially available from ALBRIGHT & WILSON, in 2.7 kg demineralized water. The reactor was put under nitrogen and heated to 80° C. Then, 0.6 kg of an aqueous solution of 2.5% sodiumpersulfate was added to the reactor. After 15 minutes, the monomer mixture, containing 13.26 kg styrene and 6.75 kg acrylonitrile (50/50 molar ratio), is added during 3 hours. Simultaneously, 3.4 kg of a 5% sodium persulfate solution is added during 3 hours. Then, the reaction mixture is heated during 30 minutes at 80° C. Afterward the post-initiation step takes place to convert the remaining monomer. This is done by addition of 0.144 kg of tert-butylhydroperoxide (70%) diluted with 1.25 kg of water during 2 hours and 20 minutes. Simultaneously 0.086 kg of sodium formaldehyde sulfoxylate dihydrate diluted with 3.56 kg of water is added during 2 hours and 20 minutes. The dispersion is cooled to 20° C. and 1000 ppm of the biocide Bronidox (15% in ethanol) is added. Finally the dispersion is filtered using a P10 Gaf-filter. The resulting dispersion has a pH of 2.8, a solids content of 19.8 wt % and a particle size as measured using PCS (Brookhaven BI-90) of 63 nm.

Preparation of Comparative Polymer Particle CL-02

Styrene is copolymerised via a semi-continuous emulsion polymerisation. A 100 liter reactor is filled with 70 kg of demineralized water and 3 kg Empicol ESB/70 solution (10% in water). Empicol ESB/70 is an anionic surfactant commercially available from ALBRIGHT & WILSON. The reactor was put under nitrogen and heated to 80° C. Then, 1.66 kg of an aqueous solution of 2.0% sodiumpersulfate was added to the reactor. After 15 minutes the monomer solution, containing 20 kg styrene and 5.0 g of the chain-transfer agent lauryl mercaptan, is added during 3 hours. Simultaneously, 3.34 kg of a 2% sodium persulfate solution is added during 3 hours. Then, the reaction mixture is heated during 60 minutes at 80° C. Afterward the residual monomer is removed under reduced pressure during 1 hour at 80° C. The dispersion is cooled to 20° C. and 1000 ppm of the biocide Bronidox (15% in ethanol) is added. Finally the dispersion is filtered. The resulting dispersion has pH of 2.6, a solids content of 18.9 wt % and a particle size as measured using PCS (Brookhaven BI-90) of 79 nm.

Preparation of Inventive Polymer Particle IL-01

This polymer particle was prepared in two steps: (1) preparation of the macromonomer and (2) emulsion copolymerisation.

Preparation of the Macromonomer:

A jacketed reactor of 4 liter is filled with 118.5 g of methacrylic acid, 269.9 g of water, 809.6 g of isopropanol, 1.5 g of α-methylstyrene dimer and 0.42 g of sodium persulfate. During 30 minutes a nitrogen flow is flushed through the reaction mixture at room temperature and the reactor is heated to 80° C. The reaction vessel is heated further at 80° C. during 6 hours. Afterwards 0.18 g of sodiumpersulfate was added and the reaction mixture was heated further for 18 hours. Subsequently, the isopropanol is distilled by vaccumdestilation and replaced by water. Then, the aqueous solution is cooled to room temperature and filtered. The resulting macromonomer solution has a solids content of 11.86 wt % and a pH of 2.7.

Emulsion Copolymerisation:

Next the emulsion copolymerisation is performed. A jacketed 2 liter reactor is filled with 54 g of a 10% aqueous solution of the anionic surfactant Empicol ESB/70, commercially available from ALBRIGHT & WILSON, and 981.3 g water. The reaction vessel is flushed with nitrogen and heated to 80° C. Subsequently 7 g of a 5% aqueous solution of sodiumpersulfate is added and the reactor is heated for 15 minutes. Subsequently, the monomer mixture, containing 218.9 g of styrene and 111.2 g of acrylonitrile, was added during 180 minutes. At the same time the initiator solution, containing 29 g of a 5% sodiumpersulfate aqueous solution, is added in 180 minutes. The macromonomer as prepared above, is not added initially but the addition is started after one hour. Then, 63 g of the macromonomer solution, containing 11.86% in water, is added during one hour. Then, 126 g of the macromonomer solution, containing 11.86% in water, is added during 30 minutes. Then, 86 g of the macromonomer solution, containing 11.86% in water, is added during 30 minutes. Then, the reaction mixture is heated for an additional 30 minutes at 80° C. Afterwards a post-initiation step is done to convert all residual monomer by the addition of 2.57 g of a 70% tert-butylhydroperoxide (TBHP) solution, diluted with 22.5 g of water, and 1.55 g of sodiumformaldehydesulfoxylate dihydrate (SFS.2H2O), dissolved in 120 g of water, during 140 minutes. After the addition of the TBHP and SFS.2H2O is finished, the reaction mixture is heated for 10 minutes at 80° C. Then, the dispersion is cooled at room temperature and 100 ppm of the biocide Proxel Ultra is added. The dispersion is filtered through a coarse paperfilter. The resulting dispersion has a solids content of 20.2 wt %, a pH of 3.86 and a particle size as measured with PCS (Brookhaven BI-90) of 63 nm.

Preparation of Inventive Polymer Particle IL-02

This polymer particle was prepared in two steps: (1) preparation of the macromonomer and (2) emulsion copolymerisation.

Preparation of the Macromonomer:

A jacketed reactor of 500 ml is filled with 28.8 g of methacrylic acid and 257.8 g of water. The reactor was put under vacuum and flushed with nitrogen (this was repeated 3 times). Then, 3 mg of bis(boron difluorodimethyl glyoximate)cobaltate(II) complex (hereinafter also referred to as "COBF") was added to the aqueous methacrylic acid solution under inert conditions. The solution is heated to 80° C. and then 2.88 g of the initiator solution, containing 5% aqueous solution of 4,4'-azobis (4-cyanopentanoic acid) disodium salt, is added. The reaction mixture was heated for 1 hour at 80° C. This macromonomer solution was cooled at room temperature.

Emulsion Copolymerisation:

Another jacketed reactor of 2 liter is filled with 49.7 g of the anionic surfactant Empicol ESB/70, commercially available from ALBRIGHT & WILSON, and 1069.1 g water. This reactor is flushed with nitrogen and the macromonomer solution is added to the reactor keeping it under inert conditions. Then the reactor is heated to 80° C. and 6.62 g of the initiator solution, containing a 5% aqueous sodiumpersulfate solution, is added. The reaction mixture is heated then for 15 minutes at 80° C. and, subsequently, 165.6 g of styrene and 13.2 g of the initiator solution, containing 5% aqueous solution of sodiumpersulfate, is dosed in 90 minutes. Afterwards the reaction mixture is heated for an additional 60 minutes and the residual monomer is removed under reduced pressure (during 60 minutes). The dispersion is then cooled and filtered. The resulting dispersion has a solid concentration of 13.69 wt %, a pH of 2.84 and a particle size as measured by PCS (Brookhaven BI-90) of 65 nm.

Preparation of Inventive Polymer Particle IL-03

This polymer particle was prepared in two steps: (1) preparation of the macromonomer and (2) emulsion copolymerisation.

Preparation of the Macromonomer:

A jacketed reactor of 1000 ml is filled with 57.6 g of methacrylic acid and 515.6 g water. The reactor was put under vacuum and flushed with nitrogen (this was repeated 3 times). Then, 5.8 mg of bis(boron difluorodimethyl glyoximate)cobaltate(II) complex (COBF) was added to the aqueous methacrylic acid solution under inert conditions. The solution is heated to 80° C. and, then, 5.76 g of an initiator solution, containing a 5% aqueous solution of 4,4'-azobis(4-cyanopentanoic acid) disodium salt, is added. The reaction mixture was heated during 1 hour at 80° C. This macromonomer solution was cooled at room temperature.

Emulsion Copolymerisation:

Another jacketed reactor of 2 liter is filled with 45.4 g of a 10% solution in water of the anionic surfactant Empicol ESB/70, commercially available from ALBRIGHT & WILSON, and 838.3 g water. This reactor is flushed with nitrogen and the macromonomer solution is added to the reactor keeping it under inert conditions. Then, the reactor is heated to 80° C. and 6.05 g of the initiator solution, containing 5% aqueous sodiumpersulfate solution, is added. The reaction mixture is heated then for 15 minutes at 80° C. and, subsequently, 302.4 g of styrene and a mixture of 24.2 g of the initiator solution, containing a 5% aqueous solution of sodiumpersulfate, and 4.8 g water is dosed in 180 minutes. Afterwards the reaction mixture is heated for an additional 60 minutes and the residual monomer is removed under reduced pressure (during 60 minutes). The dispersion is then cooled and filtered. The resulting dispersion has a solid concentration of 21.61 wt %, a pH of 2.70 and a particle size as measured by PCS (Brookhaven BI-90) of 94 nm.

Preparation of Inventive Polymer Particle IL-04

In a jacketed 1 liter reactor, 13.5 g of MA1007, a block copolymer of polymethylmethacrylate and polymethacrylic acid, obtained from GOLDSCHMIDT AG, was dispersed in 778 g water. To dissolve the block copolymer 10.0 g of a 29% aqueous NaOH solution was added. The reactor was flushed with nitrogen and the block copolymer solution was heated to 85° C. After the reaction vessel reaches 85° C., 90 g of styrene is added. After emulsifying the styrene monomer during 10 minutes, 9 g of the initiator solution, containing an aqueous solution of 5 wt % sodium persulfate, is added. Then, the reaction is further heated during 3 hours. Afterwards the residual monomer is removed under reduced pressure, the reaction mixture is cooled to room temperature, 100 ppm of the biocide Proxel Ultra is added, and the dispersion is filtered. The resulting dispersion has a pH of 11.26, a solids content of 11.75 wt % and a particle size of 55 nm.

Preparation of Printing Plate Precursor of Comparative Example 1

Onto an electrochemically grained and anodized aluminum substrate, an image-recording layer was coated from an aqueous coating solution at a wet thickness of 30 g/m$^2$. After drying, the image-recording layer consisted of 647 mg/m$^2$ of comparative polymer particle CL-01 (polymer particles comprising styrene and acrylonitrile in a 50:50 molar ratio and an average diameter of 63 nm), stabilised with an anionic wetting agent, 84 mg/m$^2$ of the infrared absorbing dye IR-Dye-01,

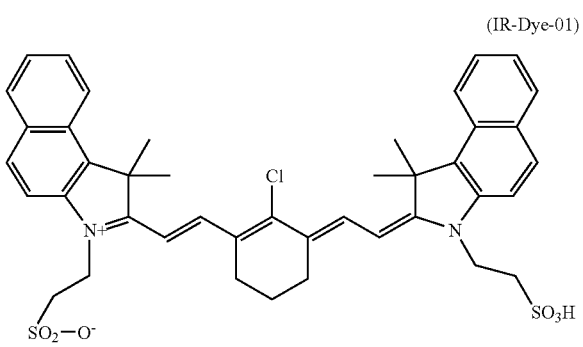

(IR-Dye-01)

84 mg/m$^2$ of GLASCOL E15, a polyacrylic acid commercially available from ALLIED COLLOIDS, and 25 mg/m$^2$ of IJX253, a cyan pigment commercially available from CABOT CORPORATION.

Preparation of the Printing Plate Precursors of Comparative Example 2 and Invention Examples 1 to 6

The preparation of these precursors was carried in the same way as described in the Comparative Example 1, with the exception that other latices were used and the latex, Glascol E15 and IJX253 pigment are present in amounts as indicated in Table 1. The inventive latices comprises in their shell an amount of hydrophilic polymer and this is compensated by a reduced amount of Glascol E15 in the formulation.

TABLE 1

| EXAMPLE (number) | POLYMER PARTICLE (type) | POLYMER PARTICLE (mg/m$^2$) | GLASCOL E15 (mg/m$^2$) | IR-Dye-01 (mg/m$^2$) | IJX253 (mg/m$^2$) |
|---|---|---|---|---|---|
| Comparative Example 1 | CL-01 | 647 | 84 | 84 | 25 |
| Comparative Example 2 | CL-02 | 647 | 84 | 84 | 25 |
| Inventive Example 1 | IL-01 | 703 | 28 | 84 | 25 |
| Inventive Example 2 | IL-02 | 703 | 28 | 84 | 25 |
| Inventive Example 3 | IL-02 | 731 | 0 | 84 | 25 |
| Inventive Example 4 | IL-03 | 703 | 28 | 84 | 25 |
| Inventive | IL-03 | 731 | 0 | 84 | 25 |

TABLE 1-continued

| EXAMPLE (number) | POLYMER PARTICLE (type) | POLYMER PARTICLE (mg/m$^2$) | GLAS-COL E15 (mg/m$^2$) | IR-Dye-01 (mg/m$^2$) | IJX253 (mg/m$^2$) |
|---|---|---|---|---|---|
| Example 5 Inventive Example 6 | IL-04 | 647 | 84 | 84 | 25 |

Exposure and Development

The printing plate precursors were exposed with a CREO TRENDSETTER 3244 T, a plate-setter available from CREO, Burnaby, Canada, at 2450 dpi at different energy densities ranging from 150 mJ/cm$^2$ to 300 mJ/cm$^2$. After imaging, the plates were cleaned with a gum solution containing 31 ml/l DOWFAX 3B2 SURFACTANT SOLUTION, 45 wt % in water (available from DOW CHEMICAL), and 68 g/l of potassium dihydrogen phosphate(2 aqua) (available from CALDIC Belgium n.v.) in a CRF85 processing apparatus (available from AGFA), fitted with a rotating brush, at a transport speed of 0.6 m/minute. The pH of the gum solution was 7.0.

Sensitivity

The optical density of the image pattern (1×1 and 8×8 checkerboard) on the plates are measured with a GRETAG D19c-densitometer, using a cyan filter, for the different exposed energy densities. The sensitivity on the plate was measured as explained in EP 04101643.7, filed on Apr. 21, 2004. In summery, the sensitivity corresponds to the energy density where the optical densities of the two checkerboards match. The lower the energy density, the higher the sensitivity of the plate precursor.

The sensitivity of the precursors of the Invention Examples 1 to 6 are essentially in the same range as that of the Comparative Examples 1 and 2, namely between 150 and 200 mJ/cm$^2$.

Background Stain

The background stain is determined by measuring the optical density of an unexposed area. The optical density is measured with a GRETAG D19c-densitometer, supplied by GRETAG-MACBETH AG, using a cyan filter and using the uncoated substrate to calibrate the GRETAG D19c-densitometer to zero. The lower the Dmin value the lower the stain, the higher the Dmin value the higher the stain, e.g. <0.10 means low stain, 0.10 to 0.20 means moderate stain, >0.2 means heavy stain.

Residual Polymer

The residual polymer left on the non-exposed areas of the plate after imaging and developing was measured using gas chromatography mass spectroscopy. This amount of residual polymer left on the non-exposed areas of the plate is also a measure for background stain and has to be as low as possible, e.g. <100 mg/m$^2$.

Shelf-life Test

The printing plate precursors (250 mm×440 mm) are packed in black non-humidity proof paper without interleave paper between the plates. The whole package is then stored at 35° C. at 85% relative humidity for 7 days. After ageing the precursors under these conditions, the precursors are exposed and developed according to the exposing step and development step described above. The background stain and the residual polymer left on the non-exposed areas were then measured as described above.

Printing

The printing plates, obtained after processing, were used as a master in a printing process on a GTO46 printing press, available from Heidelberger Druckmaschinen AG, Heidelberg, Germany, using K&E800 ink and 4% of Combifix XL and 10% of isopropanol as a fountain solution on high quality paper. The Invention Examples 1 to 6 exhibits good prints without toning in comparison with the Comparative Examples 1 and 2 which suffer from toning.

The results of the background stain and residual polymer left on the plate after cleaning are summarized in Table 2.

TABLE 2

| EXAMPLE (number) | BACKGROUND STAIN (fresh) (optical density) | BACKGROUND STAIN (after ageing) (optical density) | RESIDUAL POLYMER (after ageing) (mg/m$^2$) |
|---|---|---|---|
| Comparative Example 1 | 0.00 | 0.35 | 131 |
| Comparative Example 2 | 0.00 | 0.25 | |
| Inventive Example 1 | 0.00 | 0.14 | 61 |
| Inventive Example 2 | 0.00 | 0.17 | 67 |
| Inventive Example 3 | 0.00 | 0.06 | 53 |
| Inventive Example 4 | 0.00 | 0.15 | |
| Inventive Example 5 | 0.00 | 0.02 | 36 |
| Inventive Example 6 | 0.00 | 0.07 | |

The results of the Invention Examples 1 to 6 demonstrate that the printing plate precursors comprising one of the inventive polymer particle IL-01, IL-O$_2$, IL-03 or IL-04, exhibit a improved clean-out after ageing as indicated by a reduced background stain after ageing and a reduced amount of residual polymer left on the non-exposed areas of the plate after ageing, resulting in a toning free prints on the press. The Comparative examples 1 or 2 which do not comprise a polymer particle according the present invention, exhibit an higher level of background stain and a higher amount of residual latex left on the non-exposed areas of the plate after ageing, resulting in toning on the press.

The invention claimed is:

1. A method of making a negative-working lithographic printing plate comprising the steps of:
    (1) providing a lithographic printing plate precursor comprising on a grained and anodized aluminum support, having a hydrophilic surface, a coating comprising polymer particles and an infrared light absorbing agent;
    (2) exposing said coating to heat, thereby inducing coalescence of said polymer particles at exposed areas of said coating; and
    (3) developing said precursor by applying a gum solution to said coating, thereby removing non-exposed areas of said coating from said support;
wherein said polymer particles prior to exposure are core-shell particles comprising a hydrophobic heat-softenable core comprising a heat-softenable polymer having a minimum film-forming temperature above ambient temperature and a hydrophilic shell, and wherein the shell comprises a hydrophilic polymer which is soluble in water at neutral pH or at a pH ranging between 5 and 7.

2. The method according to claim 1, wherein said shell is present in an amount of 1 to 30 wt % of the total weight of the core-shell particle.

3. The method according to claim 1, wherein said core is present in an amount of 70 to 99 wt % of the total weight of the core-shell particle.

4. The method according to claim 1, wherein said gum solution has a pH-value between 5 and 7.

5. The method according to claim 1, wherein said gum solution comprises an anionic surfactant and an alkali-metal salt of a monobasic or dibasic phosphate.

6. A method of making a negative-working lithographic printing plate comprising the steps of:
   (1) providing a lithographic printing plate precursor comprising on a grained and anodized aluminum support, having a hydrophilic surface, a coating comprising polymer particles and an infrared light absorbing agent;
   (2) exposing said coating to heat, thereby inducing coalescence of said polymer particles at exposed areas of said coating; and
   (3) developing said precursor by applying a gum solution to said coating, thereby removing non-exposed areas of said coating from said support;
   wherein said polymer particles are core-shell particles comprising a hydrophobic heat-softenable core and a hydrophilic shell, wherein the shell comprises a hydrophilic polymer which is soluble in water at neutral pH or at a pH ranging between 5 and 7, and
   wherein the core of said particles comprises at least one of the polymers selected from polyethylene, poly(vinyl chloride), poly(methyl (meth)acrylate), poly(ethyl (meth)acrylate), poly(vinylidene chloride), poly(meth)acrylonitrile, poly(vinyl carbazole), polystyrene or copolymers thereof.

7. The method according to claim 6, wherein the core of said particles comprises at least one of the polymers selected from polystyrene and poly(meth)acrylonitrile.

8. A method of making a negative-working lithographic printing plate comprising the steps of:
   (1) providing a lithographic printing plate precursor comprising on a grained and anodized aluminum support, having a hydrophilic surface, a coating comprising polymer particles and an infrared light absorbing agent;
   (2) exposing said coating to heat, thereby inducing coalescence of said polymer particles at exposed areas of said coating; and
   (3) developing said precursor by applying a gum solution to said coating, thereby removing non-exposed areas of said coating from said support;
   wherein said polymer particles are core-shell particles comprising a hydrophobic heat-softenable core and a hydrophilic shell, wherein the shell comprises a hydrophilic polymer which is soluble in water at neutral pH or at a pH ranging between 5 and 7, and
   wherein the shell of said particles comprises at least one of the polymers selected from poly (meth)acrylic acid, polyethyleneoxide, polyvinyl alcohol or sulfoethyl methacrylate.

9. The method according to claim 8, wherein the shell of said particles comprises at least one of the polymers selected from poly (meth)acrylic acid.

10. The method according to claim 6, wherein the shell of said particles comprises at least one of the polymers selected from poly (meth)acrylic acid, polyethyleneoxide, polyvinyl alcohol or sulfoethyl methacrylate.

11. The method according to claim 10, wherein the core of said particles comprises polystyrene and poly(meth)acrylonitrile and the shell of said particles comprises poly (meth)acrylic acid.

12. The method according to claim 1, wherein the hydrophobic polymer has a minimum film-forming temperature above 50° C.

13. The method according to claim 12, wherein the hydrophobic polymer has a minimum film-forming temperature above 80° C.

\* \* \* \* \*